(12) United States Patent
Corleto et al.

(10) Patent No.: US 6,192,089 B1
(45) Date of Patent: Feb. 20, 2001

(54) ELECTRONIC CIRCUIT AND METHOD FOR AUTOMATIC FREQUENCY CONTROL

(75) Inventors: Jose G. Corleto, Lake Worth; Brian Todd Kelley, Delray Beach, both of FL (US); Shareq Rahman, Avenel, NJ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/130,930

(22) Filed: Aug. 7, 1998

(51) Int. Cl.⁷ .................................................. H04L 27/06
(52) U.S. Cl. ............................................. 375/344; 375/316
(58) Field of Search ..................................... 375/344, 316, 375/377; 348/735

(56) References Cited

U.S. PATENT DOCUMENTS

| | | | |
|---|---|---|---|
| 3,988,679 | * 10/1976 | Clarke et al. | |
| 4,837,853 | * 6/1989 | Heck | 455/208 |
| 4,896,287 | 1/1990 | O'Donnell et al. | |
| 4,945,505 | * 7/1990 | Wiener et al. | |
| 5,559,836 | * 9/1996 | Nishijima | 375/318 |
| 5,668,749 | 9/1997 | Corleto et al. | |
| 5,701,600 | * 12/1997 | Wetters et al. | 455/208 |
| 5,748,682 | * 5/1998 | Mobin | 375/344 |
| 5,963,600 | * 10/1999 | Rausch et al. | 375/344 |
| 6,003,054 | * 12/1999 | Oshima et al. | 708/230 |

* cited by examiner

Primary Examiner—Chi H. Pham
Assistant Examiner—Jean B. Corrielus
(74) Attorney, Agent, or Firm—Randi L. Dulaney

(57) ABSTRACT

An automatic frequency control circuit (84) and a method for automatic frequency control in a digital receiver includes a CORDIC vector rotation processor (88), an FM demodulator (100) and an integrator (72). The circuit and method utilize the CORDIC computing technique to simplify required circuitry and to reduce required software processing power over conventional automatic frequency control techniques.

10 Claims, 14 Drawing Sheets

ANGLE ACCUMULATION

| CYCLE | ITERATIONS | OPERATIONS (NOTE: β = SIGN QuadREG) | COMMENTS |
|---|---|---|---|
| 1 | -1 | I/Q REG <= External Bus | Input I(n) from external bus |
| 2 | -1 | InphREG <= I/Q REG; I/Q REG <= External Bus | Input Q(n), Store I(n) in Inphase register |
| 3 | -1 | QuadREG <= I/Q REG | Store Q(n) in Quadrature register |
| 4 | 0 | ACCREG <= 0 -β* ATANROM | $\theta(0) = 0 - \beta^* \pi/2$ |
| 5 | 0 | θREG <= ACCREG; ACCREG <= 0 - β*QuadREG | $I(0) = 0 - \beta^*$ QuadREG |
| 6 | 0 | InphREG <= ACCREG; ACCREG <= 0 + β*InphREG | $Q(0) = 0 + \beta^*$ InphREG |
| 7 | 1 | QuadREG <= ACCREG; ACCREG <= θREG - β*ATANROM | $\theta(1) = \theta(0) - \beta^*$ ATAN$(2^0)$ |
| 8 | 1 | θREG <= ACCREG; ACCREG <= InphREG - β*QuadREG>>0 | $I(1) = I(0) - \beta^* Q(0)^*(2^0)$ |
| 9 | 1 | InphREG <= ACCREG; ACCREG <= QuadREG + β*InphREG>>0 | $Q(1) = Q(0) + \beta^* I(0)^*(2^0)$ |
| 10 | 2 | QuadREG <= ACCREG; ACCREG <= θREG - β*ATANROM | $\theta(2) = \theta(1) - \beta^*$ ATAN$(2^{-1})$ |
| 11 | 2 | θREG <= ACCREG; ACCREG <= InphREG - β*QuadREG>>1 | $I(2) = I(1) - \beta^* Q(1)^*(2^{-1})$ |
| 12 | 2 | InphREG <= ACCREG; ACCREG <= QuadREG + β*InphREG>>1 | $Q(2) = Q(1) + \beta^* I(1)^*(2^{-1})$ |
| 3*L+4 | L | QuadREG <= ACCREG; ACCREG <= θREG - β*ATANROM | $\theta(L) = \theta(L-1) - \beta^*$ ATAN$[2^{-L+1}]$ |
| 3*L+5 | L | θREG <= ACCREG; ACCREG <= InphREG - β*QuadREG>>(L-1) | $I(L) = I(L-1) - \beta^* Q(L-1)^*[2^{-L+1}]$ |
| 3*L+6 | L | InphREG <= ACCREG; ACCREG <= QuadREG + β*InphREG>>(L-1) | $Q(L) = Q(L-1) + \beta^* I(L-1)^*[2^{-L+1}]$ |
| 3*L+7 |  | θREG <= ACCREG; QuadREG <= ACCREG | $\theta(L+1) = \theta(L) - \beta^*$ ATAN$[2^{-L}]$ |
| 3*L+8 |  | θREG <= ACCREG; QuadREG <= ACCREG | Store θ(L+1) in θREG and QuadREG |
| 3*L+9 |  | ACCREG <= θ(n)REG - θ(n-1)REG | Differentiate the angle to get Fmout |
| 3*L+10 |  | Qo/Fmout <= ACCREG | Output Fmout to Qo/FmoutREG |
| 3*L+11 |  | ACCREG <= 0 + QuadREG; InphREG <= SAT(ACCREG) | Update θ(n-1); save clipped Fmout in InphREG |
| 3*L+12 |  | θ(n-1)REG <= ACCREG; ACCREG <= α(n-1)REG + InphREG >>K | Apply loop gain $2^{-K}$) to clipped Fmout value |
| 3*L+13 |  | α(n-1)REG <= αREG, InphREG <= ACCREG | Accumulate freq error in αREG |
| 3*L+14 |  | αREG <= ACCREG; ACCREG <= α(n-1)REG + InphREG | Store freq error in αREG |
| 3*L+15 |  | α(n-1)REG <= α(n)REG, InphREG <= ACCREG | Save updated error in α(n-1); save α(n) in InphREG |
| 3*L+16 |  | α(n)REG <= ACCREG; ACCREG <= 0 - InphREG | Set α(n) = α(n); update α(n) |
| 3*L+17 |  | θ(n)REG <= ACCREG | Save θ(n) rotation angle |

*FIG. 17*

VECTOR ROTATION

| CYCLE | ITERATIONS | OPERATIONS (NOTE: β = SIGN θREG) | COMMENTS |
|---|---|---|---|
| 1 | -1 | I/Q REG <= External Bus | Load I(n) from external bus |
| 2 | -1 | InphREG <= I/Q REG; I/Q REG <= External Bus | Load Q(n) move I(n) to InphREG |
| 3 | -1 | QuadREG <= I/Q REG | Move Q(n) to QuadREG |
| 4 | 0 | ACCREG <= 0 - β*QuadREG | $I(0) = 0 - β* Q(n)$ |
| 5 | 0 | InphREG <= ACCREG; ACCREG <= 0 + β*InphREG | $Q(0) = 0 + β*I(n)$ |
| 6 | 0 | QuadREG <= ACCREG; ACCREG <= θREG - β*ATANROM | $θ(0) = θ(n) - β*π/2$ |
| 7 | 1 | θREG <= ACCREG; ACCREG <= InphREG - β*QuadREG>>0 | $I(1) = I(0) - β* Q(0)*(2^0)$ |
| 8 | 1 | InphREG <= ACCREG; ACCREG <= QuadREG + β*InphREG>>0 | $Q(1) = Q(0) + β*I(0)*(2^0)$ |
| 9 | 1 | QuadREG <= ACCREG; ACCREG <= θREG - β*ATANROM | $θ(1)=θ(0) - β* ATAN(2^0)$ |
| 10 | 2 | θREG <= ACCREG; ACCREG <= InphREG - β*QuadREG>>1 | $I(2) = I(1) - β* Q(1)*(2^{-1})$ |
| 11 | 2 | InphREG <= ACCREG; ACCREG <= QuadREG + β*InphREG>>1 | $Q(2) = Q(1) + β* I(1)*(2^{-1})$ |
| 12 | 2 | QuadREG <= ACCREG; ACCREG <= θREG - β*ATANROM | $θ(2) = θ(1) - β* ATAN(2^{-1})$ |
| 13 | 3 | θREG <= ACCREG; ACCREG <= InphREG - β*QuadREG>>2 | $I(3) = I(2) - β* Q(2)*(2^{-2})$ |
| 14 | 3 | InphREG <= ACCREG; ACCREG <= QuadREG + β*InphREG>>2 | $Q(3) =Q(2) + β* I(2)*(2^{-2})$ |
| 15 | 3 | QuadREG <= ACCREG; ACCREG <= θREG - β*ATANROM | $θ(3) = θ(2) - β ATAN(2^{-2})$ |
| 3*L+4 | L | θREG <= ACCREG; ACCREG <= InphREG - β*QuadREG>>(L-1) | $I(L)=I(L-1) - β* Q (L-1)*[2^{(-L+1)}]$ |
| 3*L+5 | L | IoREG <= ACCREG; ACCREG <= QuadREG + β*InphREG>>(L-1) | $Q(L) = Q(L-1) + β* I(L-1)*[2^{(-L+1)}]$ |
| 3*L+6 | L | Qo/FmoutREG <= ACCREG; ACCREG <= θREG - β*ATANROM | $θ(L) = θ(L-1) - β* ATAN[2^{(-L+1)}]$ |

*FIG. 18*

ELECTRONIC CIRCUIT AND METHOD FOR AUTOMATIC FREQUENCY CONTROL

FIELD OF THE INVENTION

This invention relates in general to digital receivers, and more specifically to digital receivers that utilize automatic frequency control.

BACKGROUND OF THE INVENTION

The reception and processing of broadcast RF (radio frequency) signals are known in the art. Historically, the reception and processing of RF signals was performed using analog circuitry in which a number of analog components received the signals, and passed the information contained in the amplitude and phase portions of the signals along for further processing and output. More recently, the advent of digital circuitry has allowed designers to create communication devices which employ digital signal processing in the processing of the RF signals.

A conventional digital receiver 10 utilized in radio communication systems is illustrated in FIG. 1. The conventional digital receiver 10 receives a broadcast input signal 14 sent from a radio communication system 12 in an analog format using an antenna 16. A (radio frequency) RF interface 18 then amplifies the broadcast input signal 14, passes the frequency component of the broadcast input signal 14, and remodulates the desired frequency component to an (intermediate frequency) IF signal 20. An analog mixer 22 then mixes down to baseband the IF signal 20 using a reference frequency 26, such as the output of a voltage controlled oscillator, to produce a baseband signal 24. An analog to digital converter 28 receives the baseband signal 24 and converts it from an analog signal to a digital signal 30 which includes an in-phase signal and a quadrature signal. The digital signal 30 is then digitally filtered by a filter 32 to improve the selectivity of the receiver and reduce the adjacent channel interference. The filtered signal 34 is then decimated to a lower sampling frequency, the decimation step consisting of down-sampling with a down-sampler 36; and low pass filtering with a low pass filter 40 to a new sampling rate. Downsampling comprises selectively discarding input data and adjusting the output data such that the transmission rate of the output data is at a different clock rate than the input data clock rate. Once the signal 42 is sampled at a lower rate, it can be further processed digitally to remove induced noise and to retrieve the signal that was encoded by the radio communication system 12.

Due to frequency fluctuations between the carrier frequency and the local oscillator frequency, continual adjustment of a frequency difference between the two frequencies is required to avoid errors in the retrieval of the signal. This procedure of adaptively adjusting the local oscillator frequency to track the carrier frequency is known as automatic frequency control (AFC). The frequency shifts in the signal due to drifts in the local oscillator frequency in the digital receiver's front end (such as RF interface 18) and other noise factors make AFC a challenge to implement.

One conventional method of AFC is shown in FIG. 1, comprising a demodulator 44, a (digital signal processor) DSP 48, a digital to analog converter 52 and a (voltage controlled oscillator) VCO 56. The demodulator 44 demodulates the signal to produce a conventional FM demodulated signal 46. FM information is then extracted from the conventional FM demodulated signal 46. The DSP 48 determines a frequency offset and compensation value, outputs the digital frequency compensation value 50, which is converted to an analog frequency compensation value 54 by the digital to analog converter 52. This analog frequency compensation value 54 is used to vary the frequency of the VCO 56 and the output of the VCO 56 is the reference frequency 26. This technique requires the use of a high precision digital to analog converter 52. In most cases the high precision digital to analog converter 52, which is essential to accurate frequency compensation, can be difficult and expensive to realize.

A second conventional method of AFC eliminates the digital to analog converter 52 and performs the AFC using software within the DSP 48. In this method the DSP 48 mixes the signal to the appropriate frequency by using a software complex multiplier; and additionally performs the a numerically controlled oscillator function to generate a complex exponential. FIG. 2 is a block diagram illustrating a second conventional digital receiver 60 utilizing this method.

In FIG. 2, the second conventional digital receiver 60 receives a broadcast input signal 14 sent from a radio communication system 12 using an antenna 16. The broadcast input signal 14 is processed through the RF interface 18, the analog mixer 22, the analog to digital converter 28, the filter 32, and the down-sampler 36 similarly to previously described for the conventional digital receiver 10. In some scenarios, the analog mixer coarsely adjusts the signal using the AFC computations as the reference 21.

In the second conventional AFC method shown in FIG. 2, the output of the down-sampler 36, the downsampled signal 64, is received by a digital mixer 62, which then quadrature mixes down the downsampled signal 64 using an AFC reference frequency 82. The signal continues to be processed through a filter 40, and a demodulator 44 as previously described for the conventional digital receiver 10 of FIG.1.

In this second conventional method, the output of the demodulator 44, the demodulated signal 70, is fed into a complex multiplier consisting of an integrator 72, and a (numerically controlled oscillator) NCO 80. The integrator 72 receives a plurality of demodulated signals 70, and performs a successive accumulation function including all past values of the demodulated signals 70. The NCO 80 receives the output of the integrator 72, the integrated signal 76, and generates a complex value representation of the phase of this integrated signal 76. The output of the NCO 80 is the AFC reference signal 82 which is mixed with the downsampled signal 64 in the digital mixer 62.

The implementation of this second conventional method of automatic frequency control using DSP software is computationally complex and may require a significant amount of processing power.

The two conventional apparatus and techniques for automatic frequency control described above are representative of the design approaches currently utilized. Analysis of these two apparatus indicates that there exists a need in the art for an apparatus that efficiently, with minimal circuit components and minimal power consumption, performs automatic frequency control.

BRIEF DESCRIPTION OF THE DRAWINGS

FIGS. 17 and 18 illustrate the operation of the processor architecture of FIG. 16.

DESCRIPTION OF THE PREFERRED EMBODIMENT

Generally, the present invention provides, in a digital receiver, an electronic circuit and method for automatic frequency control. The invention takes advantage of the properties of a Coordinate Rotation Digital Computer, along with a filter, FM demodulator, and integrator to perform the automatic frequency control resulting in minimized hardware costs, software requirements, and power drain requirements as compared to conventional techniques.

Figure 3:
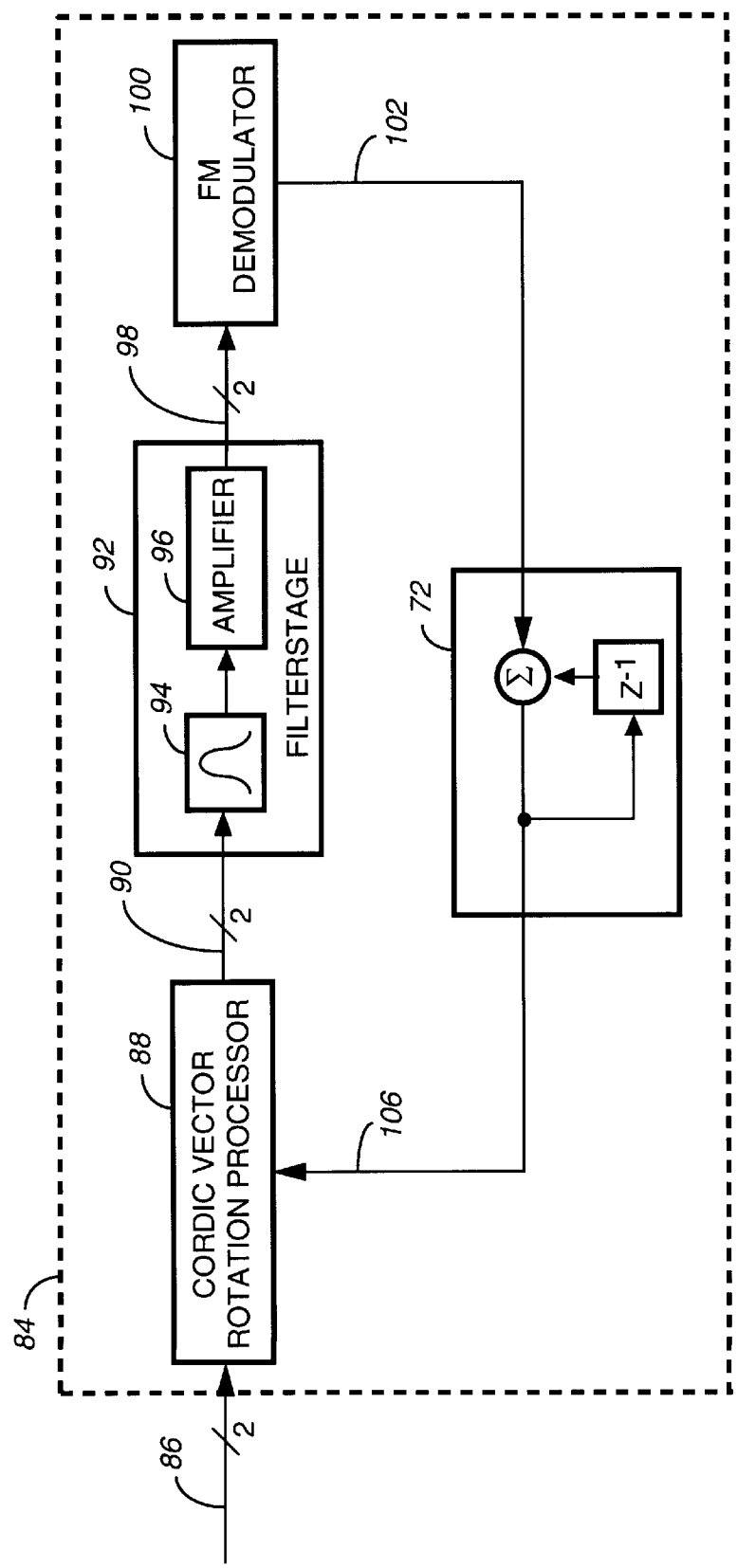
FIG. 3 is an electrical block diagram of an automatic frequency control circuit that operates in accordance with the invention.

FIG. 3 is an electrical block diagram of an automatic frequency control circuit 84 that operates in accordance with the invention. The automatic frequency control circuit 84 is comprised of a CORDIC vector rotation processor 88, an FM demodulator 100, and the integrator 72. In a preferred embodiment, the automatic frequency control circuit 84 also includes a filter stage 92.

Figure 1:
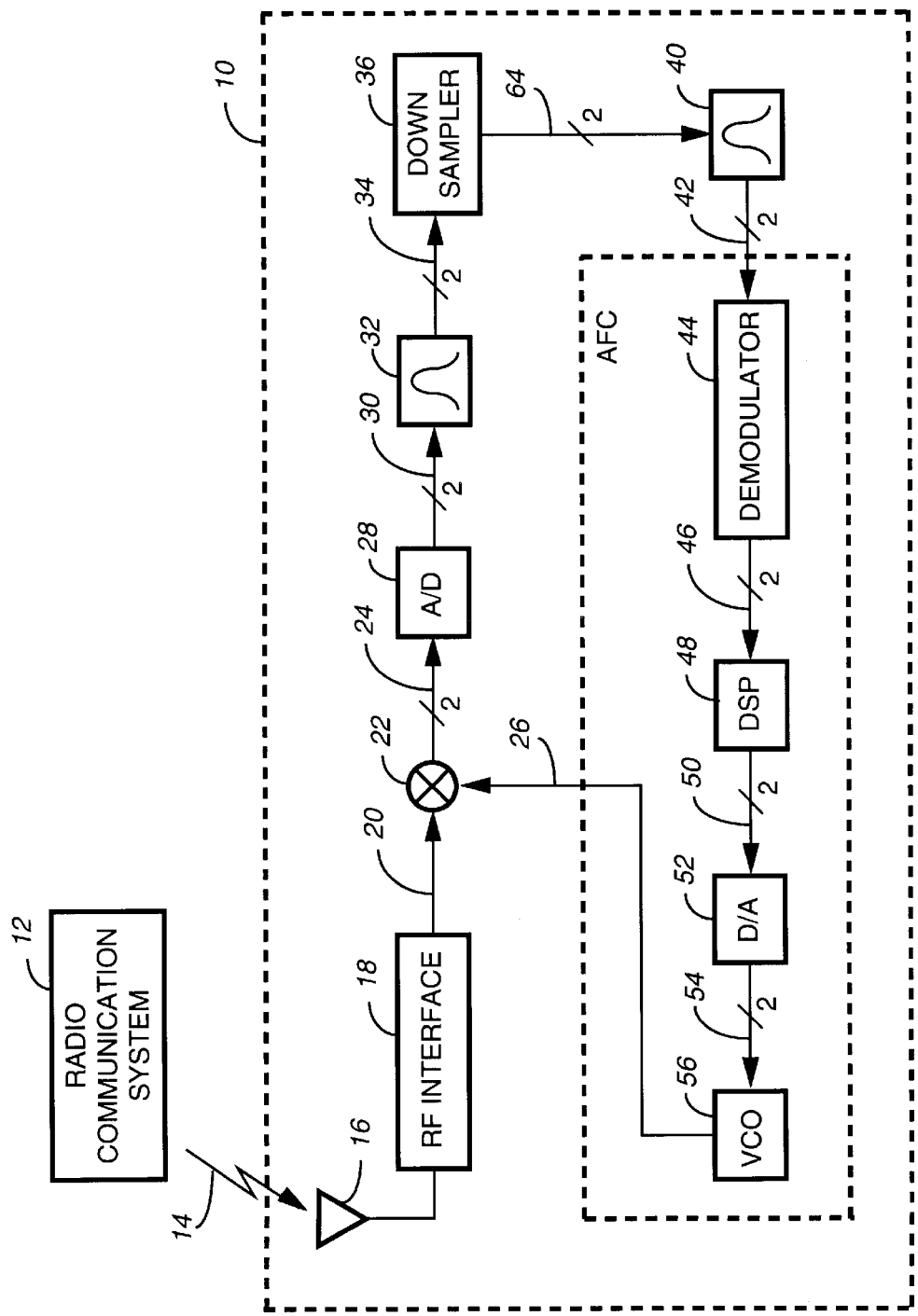
FIG. 1 is an electrical block diagram of a digital receiver which utilizes a conventional method of automatic frequency control.
Figure 2:
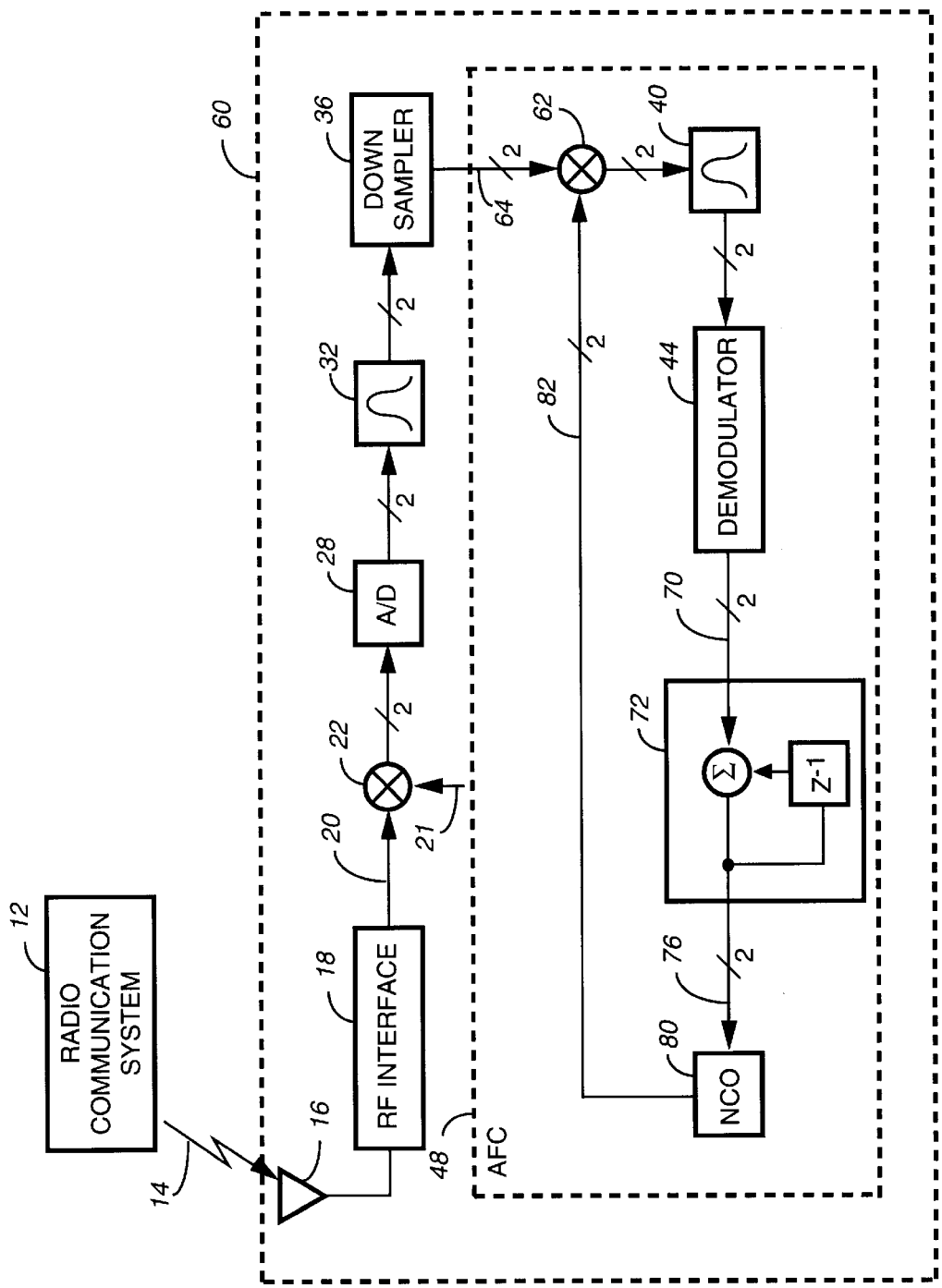
FIG. 2 is an electrical block diagram of a second digital receiver which utilizes a second conventional method of automatic frequency control.
Figure 4:
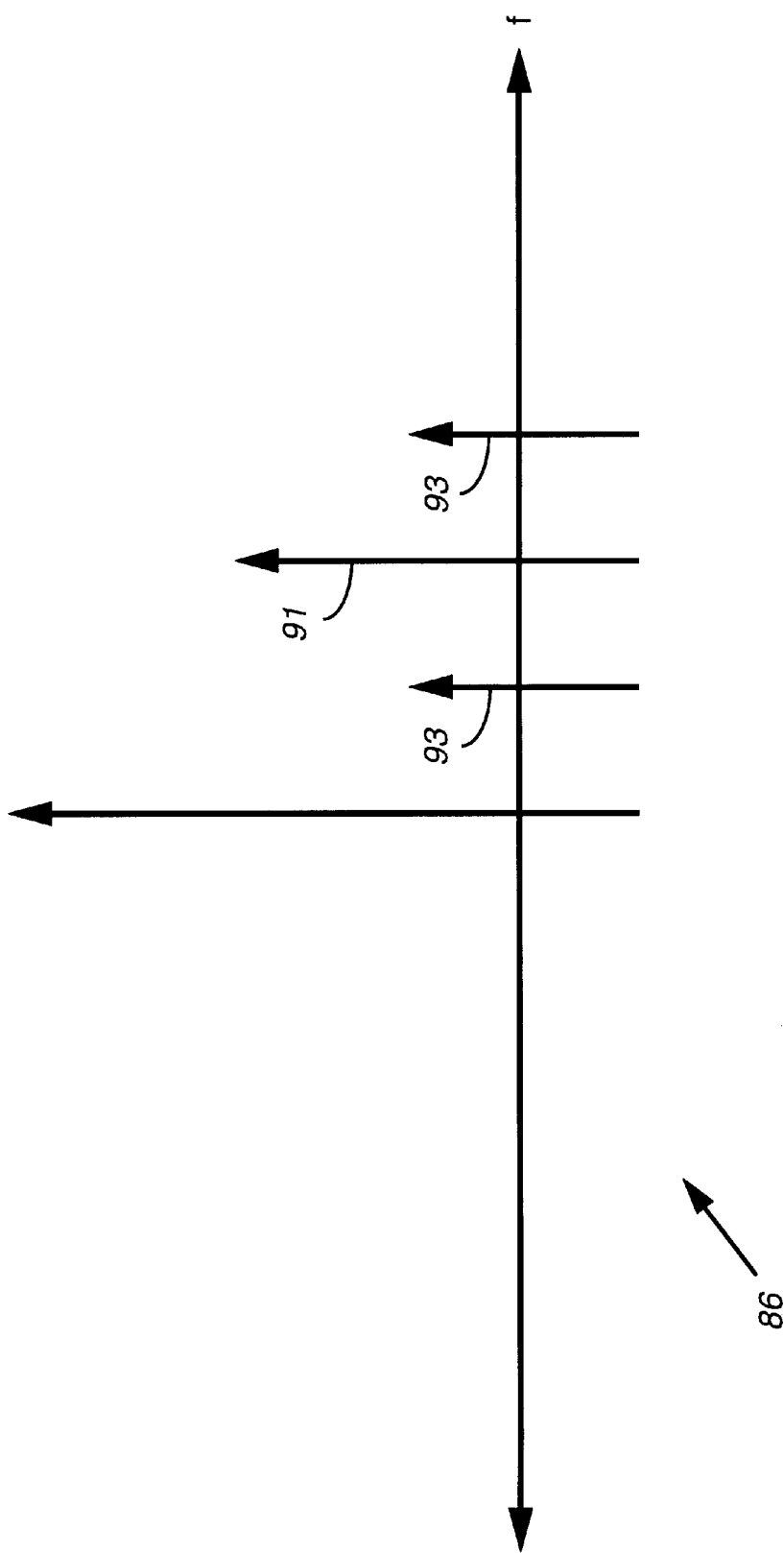
FIG. 4 illustrates a digital baseband signal received by the automatic frequency control circuit of FIG. 3.

The input signal into the automatic frequency control circuit 84 is a digital baseband signal 86. The digital baseband signal 86 is an intermediate signal formed from the processing of the broadcast input signal 14 through various RF stages of the digital receiver 10, similar to the down-sampled signal 64 of FIG. 2. The digital baseband signal 86 is a complex signal composed of a plurality of samples, is shown in FIG. 4, and is represented by the equation below:

$$Z(n)=X(n)e^{j(\omega n+\phi 1)}+Y(n)e^{j(\omega n+\phi 1)}$$

$X(n)e^{j(\omega n+\phi 1)}$ is a desirable signal 91, $Y(n) e^{j(\omega n+\phi 1)}$ is an undesirable signal 93, $\omega$ is the frequency of the input signal and $\phi 1$ is a fixed phase difference. When the value of the undesirable signal 93 approaches a value of zero, the filter stage 92 is not required.

The CORDIC vector rotation processor 88 is preferably a Coordinate Rotation Digital Computer operating in vector rotation mode. The CORDIC (Coordinate Rotation Digital Computer) apparatus and technique was initially described by J E Volder, "The CORDIC Trigonometric Computing Technique", IRE Trans. on Electronic Computers EC-8, Pp 330–334 (1959), the teachings of which are herein incorporated by reference. It is a computational system wherein a rotation through an angle can be represented as the summation of multiple rotations.

Figure 5:
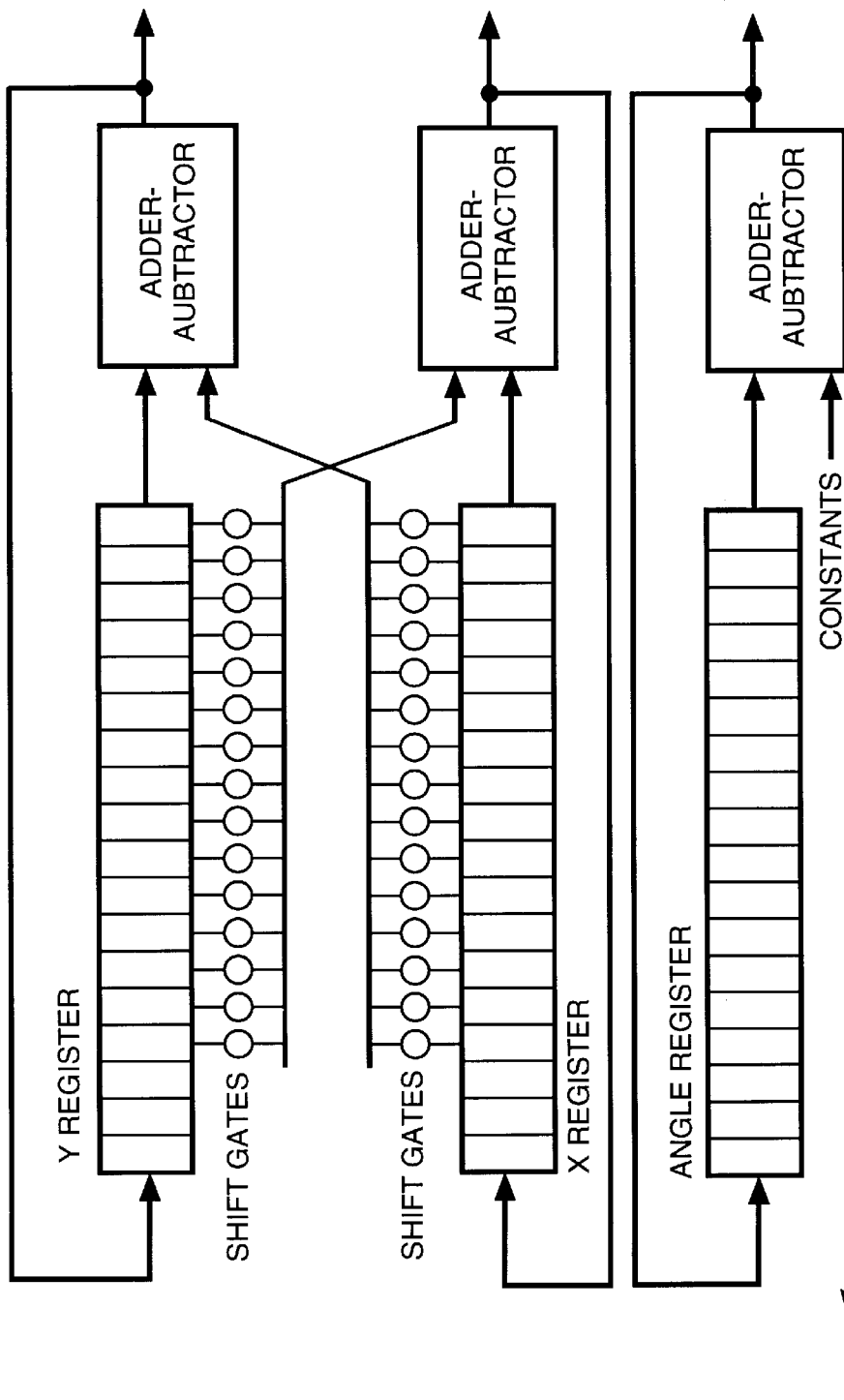
FIG. 5 illustrates a Coordinate Rotation Digital Computer.
Figure 6:
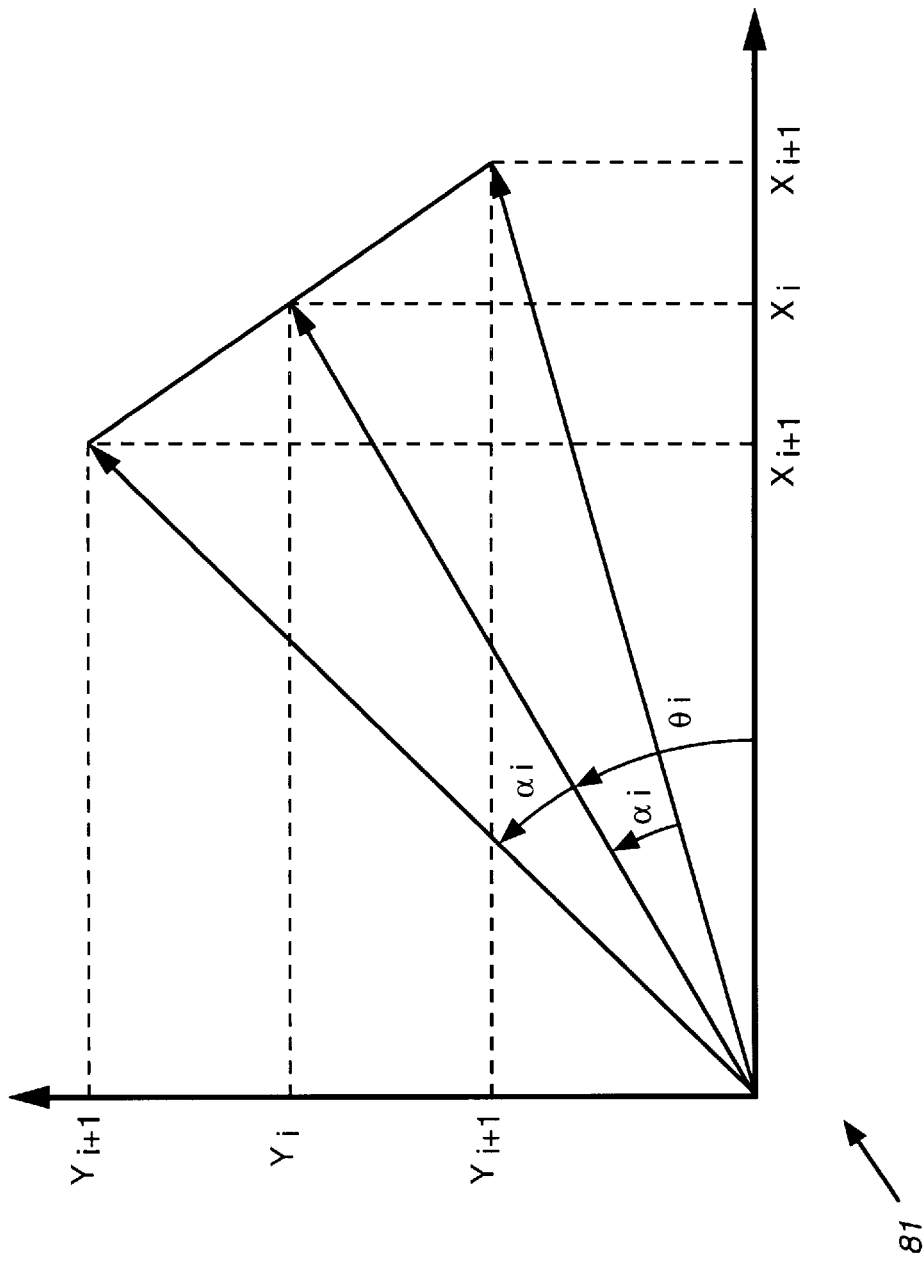
FIG. 6 illustrates a computing step of the Coordinate Rotation Digital Computer shown in FIG. 5.

The CORDIC computing technique 81 is a step-by-step sequence of rotations which result in an overall rotation through a given angle. A Coordinate Rotation Digital Computer 79 which uses the CORDIC computing technique 81 is illustrated in FIG. 5. Performing the CORDIC computing technique 81 comprises rotating the coordinate components of a first input through an angle of rotation described by a second input using trigonometric operations, and computing the coordinate components of the first input after rotation through the angle of the second input as illustrated in FIG. 6.

The CORDIC computing technique 81 can be implemented using only shift operations, subtractions and additions, thus reducing hardware requirements over conventional techniques.

Referring back to FIG. 3, the CORDIC vector rotation processor 88 receives the digital baseband signal 86, and performs the CORDIC computing technique 81 on the digital baseband signal 86 (the first input of the Coordinate Rotation Digital Computer 79 as described previously) utilizing the angle of rotation of a reference signal 106 (the second input of the Coordinate Rotation Digital Computer 79 as described previously) received from the integrator 72 to frequency shift the digital baseband signal 86 and generate a frequency shifted signal 90 (the rotated output of the Coordinate Rotation Digital Computer 79 as described previously).

This frequency shifted signal 90, generated by the CORDIC computing technique 81 is of the form:

$$Z(n)=X(n)e^{j(\omega n+\phi 1-\alpha(n))}+Y(n)e^{j(\omega n+\phi 1-\alpha(n))}$$

The angle $\alpha(n)$ in the above equation is the angle of rotation specified by the reference signal 106.

If the undesirable signal 93 (such as $Y(n) e^{j(\omega n+\phi 1-\alpha(n))}$ in the above equation), as shown in FIG. 4, is present in the frequency shifted signal 90, a filter stage 92 is added to the automatic frequency control circuit 84 at the output of the CORDIC vector rotation processor 88 to filter out the undesirable signal 93. The filter stage 92 may be implemented in a number of ways as one skilled in the art will readily appreciate. Generally, the filter stage 92 receives the frequency shifted signal 90, and performs a filtering function, for example: using a narrowband filter 94, to remove all unwanted signal components such as the undesirable signal 93, leaving the desirable signal 91. In one embodiment, the filter stage 92 includes an amplifier 96 for performance enhancement. The filter stage 92 processing generates a filtered signal 98. The filtered signal 98 is comprised of a plurality of rotated, filtered samples of the form:

$$X(n-m)e^{j(\omega n+\phi-\alpha(n))}$$

Please note that "m" in this equation is a delay introduced by the filter stage 92.

The FM demodulator 100, coupled to the output of the filter stage 92, receives the filtered signal 98, FM demodulates the filtered signal 98, thereby generating an FM demodulated signal 102, whose amplitude is proportional to the signal frequency. The FM demodulator 100 functionality may be implemented using an FM discriminator. Also, the FM demodulator 100 functionality may be implemented using digital circuitry which employs digital signal processing for the demodulation of the received signal.

The integrator 72, coupled to the output of the FM demodulator 100, receives a plurality of FM demodulated signals 102, and performs a successive accumulation of the received signals, generating the reference signal 106 utilized by the CORDIC vector rotation processor 88.

In some instances, such as demodulation of SSB (single side band) and QAM (Quadrature Amplitude Modulation) signals, very precise tuning of the carrier frequency is required during signal recovery. This is because such demodulation schemes are highly sensitive to frequency errors with respect to the carrier frequency. When the frequency error between the local oscillator which drives the mixers and the carrier itself is not sufficiently small, the recovered signal exhibits additional noise.

In order to avoid the above mentioned problems, it is necessary to maintain a very small receiver frequency error with respect to the carrier frequency, usually of the order of +/−10 Hz. The present invention performs automatic frequency control with high accuracy and precision, to minimize the frequency difference between a reference signal and a digital baseband signal, without the need for an expensive high precision analog to digital converter required in the analog approach and without the need for explicit multipliers and computationally expensive numerically controlled oscillators required in the software implementation approach.

Figure 7:
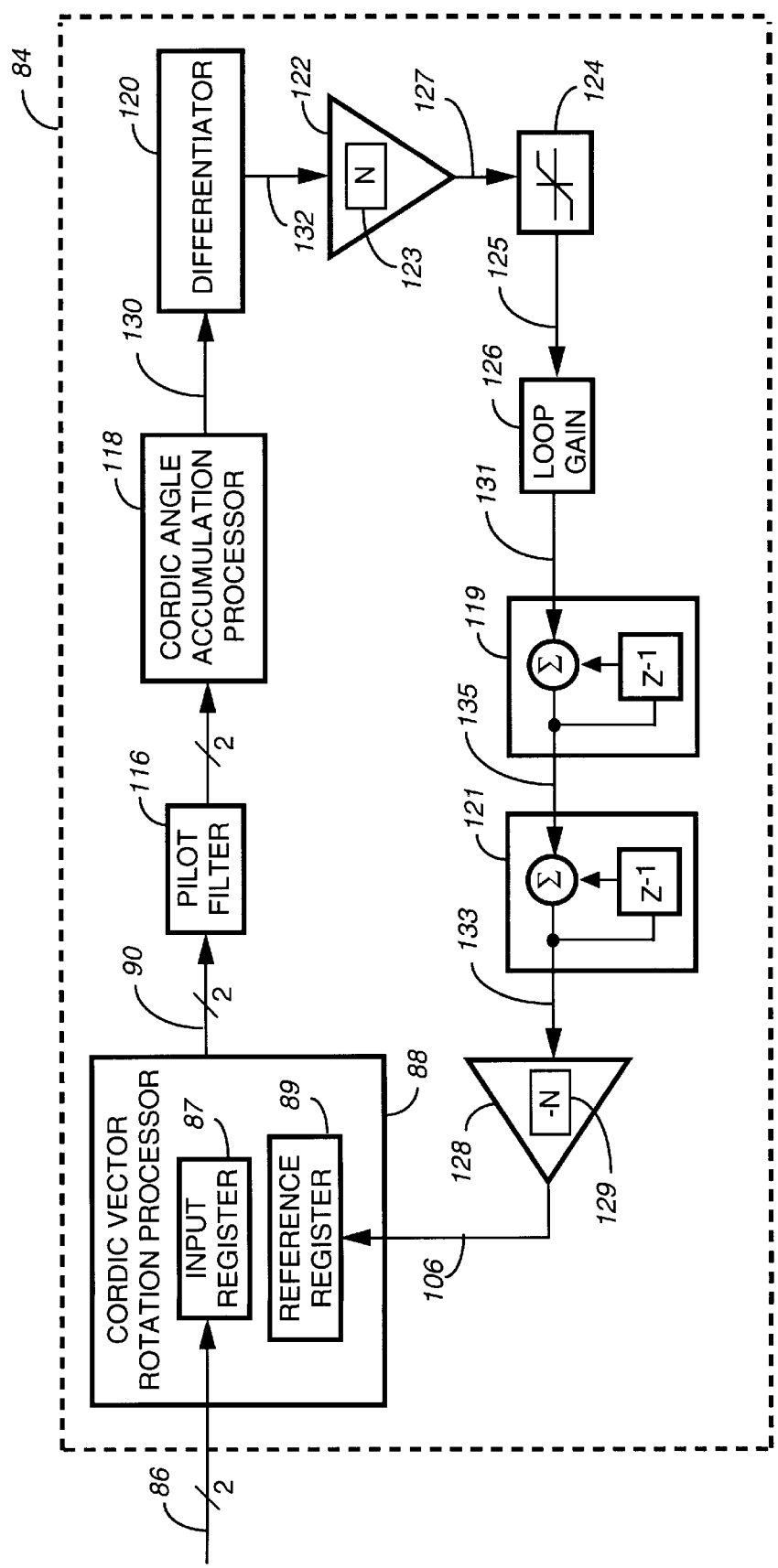
FIG. 7 is a more detailed electrical block diagram of the automatic frequency control circuit shown in FIG. 3.
Figure 8:
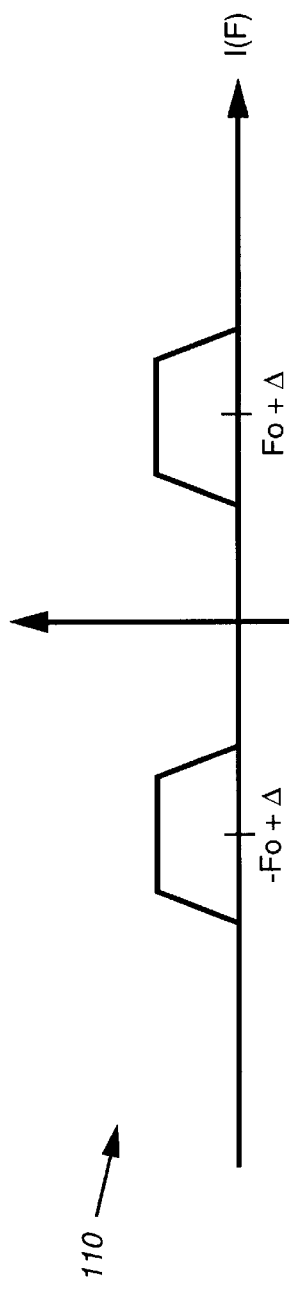
FIGS. 8, 9 and 10 illustrate components of the digital baseband signal of FIG. 4.
Figure 9:
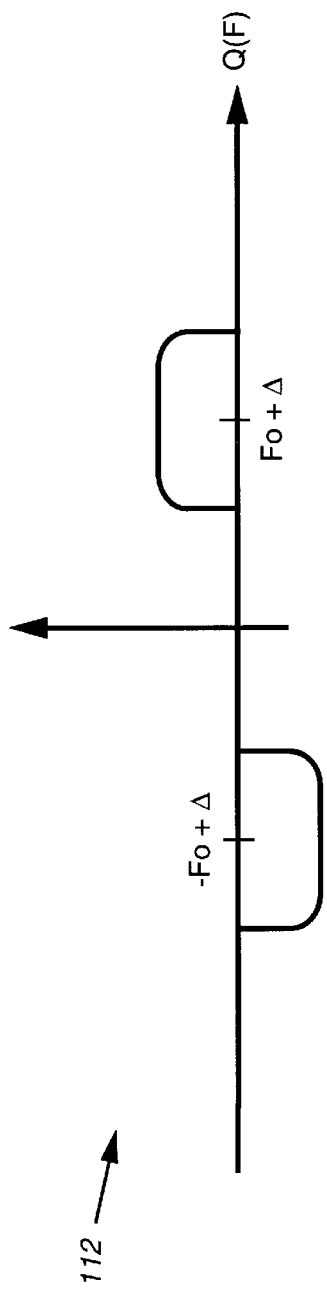
Figure 10:
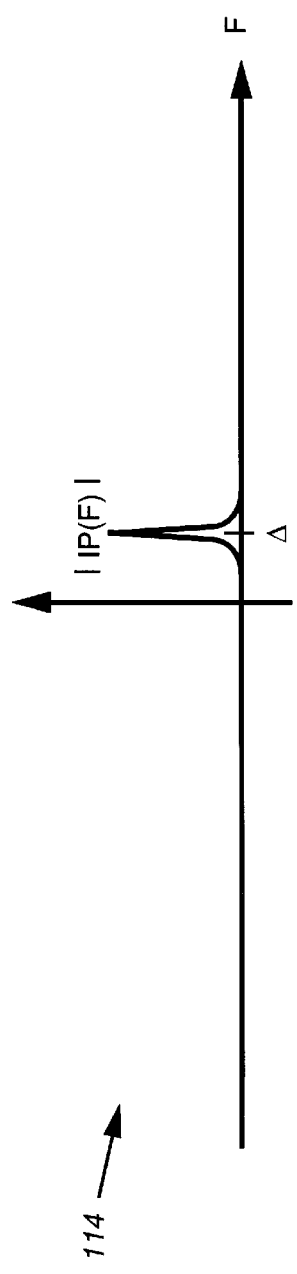

FIG. 7 illustrates one embodiment including more detail of the automatic frequency control circuit 84 of FIG. 3. The digital baseband signal 86 received by the automatic frequency control circuit 84 is comprised of an in-phase signal 110 I(n) as illustrated in FIG. 8, a quadrature signal 112 Q(n) as illustrated in FIG. 9, and a pilot tone signal 114 (which is a frequency tone) as illustrated in FIG. 10.

The automatic frequency control circuit 84 of FIG. 7 is comprised of the CORDIC vector rotation processor 88, a pilot filter 116, a CORDIC angle accumulation processor 118, a differentiator 120, a first multiplier 122, a limiter 124, a loop gain 126, a first integrator 119, a second integrator 121, and a second multiplier 128.

Figure 11:
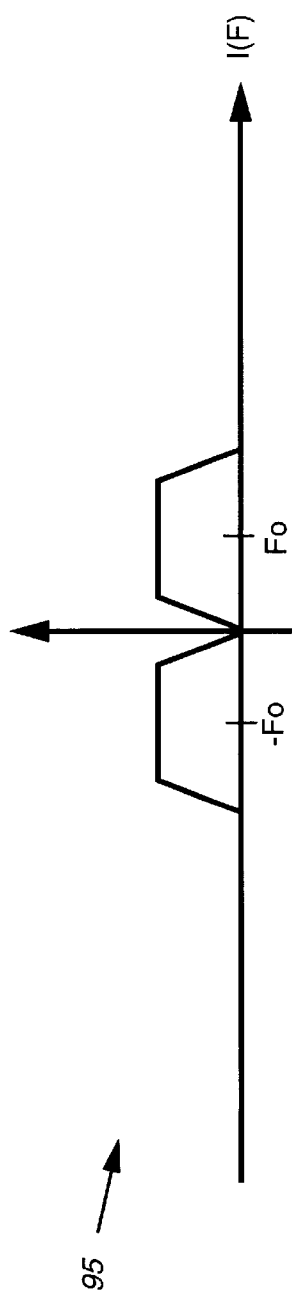
FIGS. 11, 12, and 13 illustrate components of a frequency shifted signal resulting from processing the digital baseband signal of FIG. 4 through a Coordinate Rotation Digital Computer.
Figure 12:
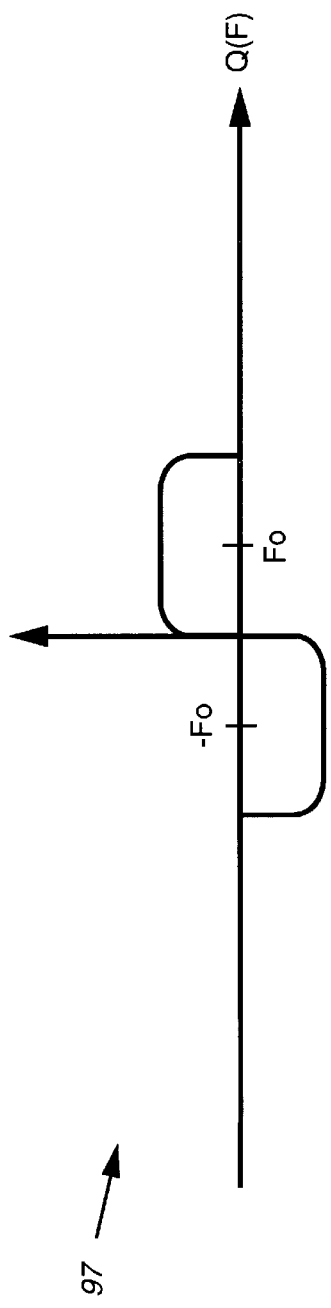
Figure 13:
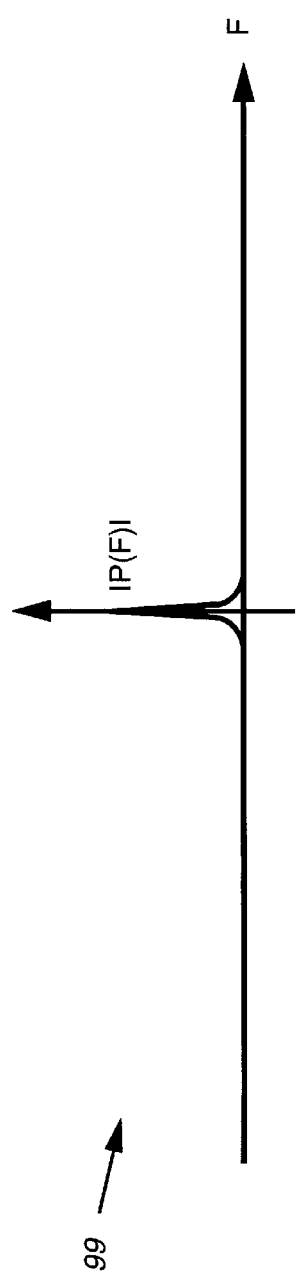

The CORDIC vector rotation processor 88 includes an input register 87 for storage of the received digital baseband signal 86, and also includes a reference register 89 for storage of the received reference signal 106. These registers may be implemented in RAM. The CORDIC vector rotation processor 88 receives the digital baseband signal 86 and the reference signal 106, and performs the CORDIC computing technique 81 as described previously for FIG. 3. The CORDIC vector rotation processor 88 produces an output which is the frequency shifted signal 90 (being the digital baseband signal 86 shifted by an amount specified by the reference signal 106). The frequency shifted signal 90 includes a frequency shifted in-phase signal 95 as illustrated in FIG. 11, a frequency shifted quadrature signal 97 as illustrated in FIG. 12, and a frequency shifted pilot tone signal 99 as illustrated in FIG. 13.

The pilot filter 116 is coupled to the output of the CORDIC vector rotation processor 88 and receives the frequency shifted signal 90, filters out any unwanted signals, leaving the frequency shifted pilot tone signal 99 remaining.

The process of FM demodulation is accomplished by the CORDIC angle accumulation processor 118, coupled to the output of the pilot filter 116, by performing the CORDIC computing technique 81, in a manner similar to that described in U.S. Pat. No. 5,668,749, Corleto et al, "Circuit for Performing Arithmetic Operations in a Demodulator", the teachings of which are herein incorporated by reference. For a plurality of samples contained within the input to the CORDIC angle accumulation processor 118, the CORDIC angle accumulation processor 118 computes the angle θe(n) defined by the frequency shifted in-phase signal 95, and the frequency shifted quadrature signal 97 of each sample, the resulting angle accumulated signal 130 may be of the form:

$$\theta e(n) = \omega n + \phi - \alpha(n)$$

The angle accumulated signal 130 then passes to the differentiator 120, which is coupled to the output of the CORDIC angle accumulation processor 118, where it is differentiated to generate a differentiated signal 132, as shown below:

$$d\theta(n)/dn = \omega - d\alpha(n)/dn$$

The first multiplier 122 is coupled to the differentiator 120 for scaling the differentiated signal 132 by a first constant value 123, normalizing to the sampling frequency and generating the normalized signal 127, indicative of the signal frequency. The limiter 124 is coupled to the first multiplier 122 output. The limiter 124 scales and clips the signal to maintain consistent processing with the presence of spikes in the signal, generating the limited signal 125. The loop gain 126 coupled to the limiter 124 provides further scaling of the limited signal 125 and generates a scaled signal 131.

The first integrator 119 is coupled to the output of the loop gain 126. The first integrator 119 accumulates a frequency error between the digital baseband signal 86 and the reference signal 106 by performing the successive accumulation functionality as described previously for the integrator 72 of FIG. 3 on a plurality of scaled signals 131, generating a frequency accumulated signal 135 which eventually converges on the frequency of the digital baseband signal 86. The second integrator 121, coupled to the output of the first integrator 119, receives the frequency accumulated signal 135 from the first integrator 119 and integrates the frequency to derive a phase 133 whose corresponding frequency converges on the frequency of the digital baseband signal 86.

Lastly, the second multiplier 128, coupled to the output of the second integrator 121, multiplies the output of the second integrator 121, the phase 133 signal, with a second constant value 129 to cancel the first multiplication, prior to inputting the resultant reference signal 106 back to the CORDIC vector rotation processor 88.

Figure 14:
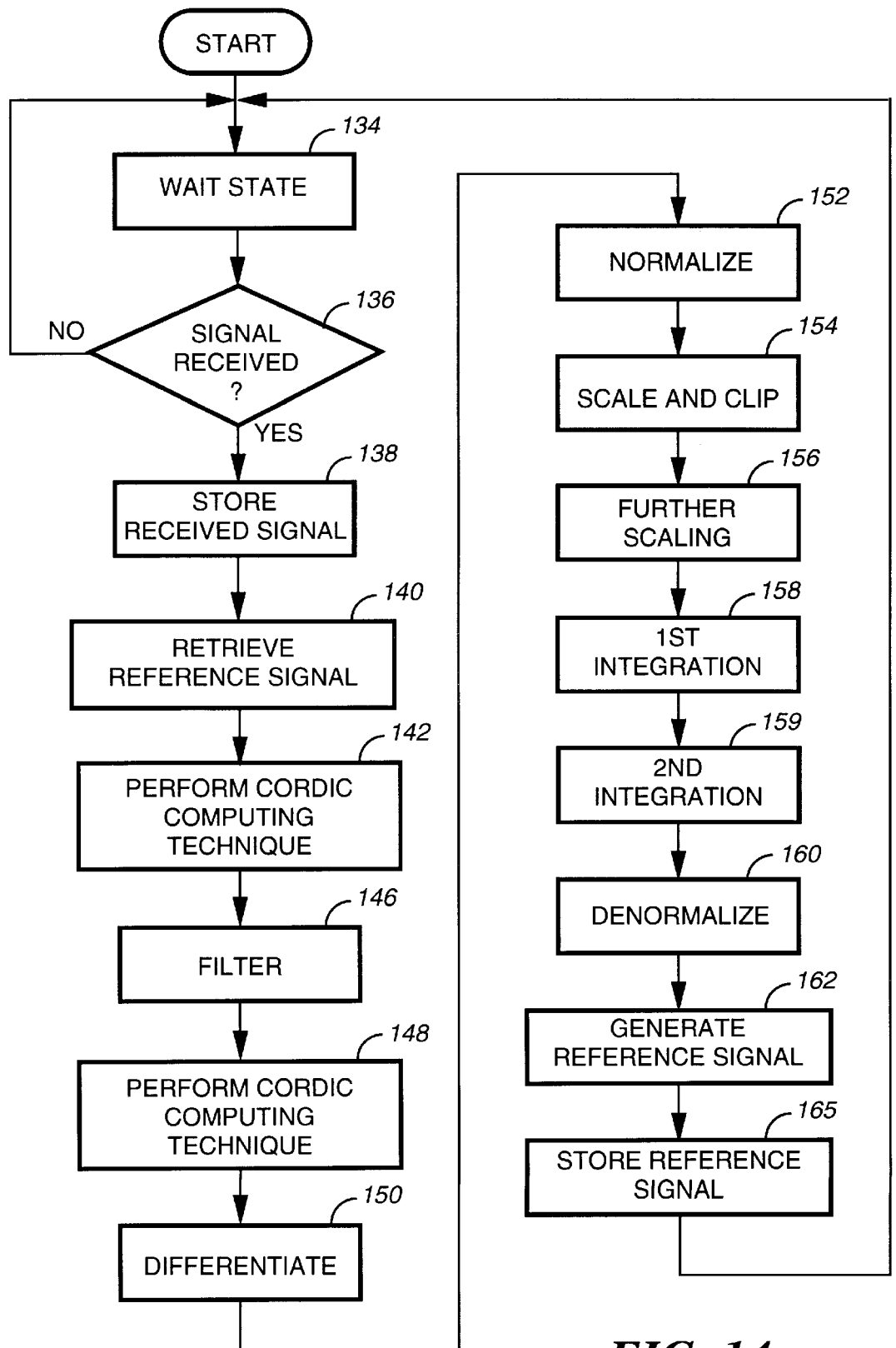
FIG. 14 is a flowchart illustrating the operation of the automatic frequency control circuit shown in FIG. 7 in accordance with the invention.

FIG. 14 is a flowchart illustrating more detail of the operation of the automatic frequency control circuit 84 of FIG. 7.

In step 134, the automatic frequency control circuit 84 is initialized in a wait state. The automatic frequency control circuit 84 remains in the wait state until the digital baseband signal 86 is received to conserve battery life. If the digital baseband signal 86 has not been received, the automatic frequency control circuit 84 remains in the wait state. When the digital baseband signal 86 is received, step 136, the digital baseband signal 86 is stored in the input register 87 of the CORDIC vector rotation processor 88 (step 138). Once the digital baseband signal 86 has been stored in the input register 87, the CORDIC vector rotation processor 88 then retrieves the reference signal 106 from the reference register 89 (step 140). Next, in step 142, the CORDIC vector rotation processor 88 performs the CORDIC computing technique 81 to adjust the frequency of the digital baseband signal 86 using the reference signal 106, generating the frequency shifted signal 90. In step 146, the frequency shifted signal 90 is filtered by the pilot filter 116, leaving only the frequency shifted pilot tone signal 99. The signal is then output to a CORDIC angle accumulation processor 118. The CORDIC angle accumulation processor 118 computes the signal θe(n) (step 148) by performing the CORDIC computing technique 81. This signal, the angle accumulated signal 130, then passes to the differentiator 120 which differentiates this signal to generate the differentiated signal 132 (step 150). In a preferred embodiment, the differentiated signal 132 is then normalized with a first constant value 123 such as fs/2π in the first multiplier 122 to map the differentiated signal 132 to the frequency of the digital baseband signal 86 (step 152), generating the normalized signal 127. The limiter 124 then scales and clips the output of the first multiplier 122, the normalized signal 127, to further maintain consistency of values, in step 154, generating the limited signal 125. The limited signal 125 is scaled further by a loop gain 126 in step 156 to generate the scaled signal 131. In step 158, a plurality of scaled signals 131 are successively accumulated by the first integrator 119, generating the frequency accumulated signal 135. The frequency accumulated signal 135, in step 159, is integrated by the second integrator 121 to derive the phase 133. In step 160, in the embodiment in which a first multiplier 122 is implemented, the output of the second integrator 121, the phase 133, is denormalized in a second multiplier 128 with a constant value such as −2π/fs to map the compensation frequency to a reference value, the reference signal 106 utilized by the CORDIC vector rotation processor 88 (step 162). The reference signal 106, in step 165, is then stored in the reference register 89, and the process cycles back to the beginning.

Iterative cycles of the above described method produces an extremely accurate frequency control method, to minimize the frequency difference between the reference signal and the digital baseband signal, with minimal hardware and software requirements as compared to conventional methods.

Figure 15:
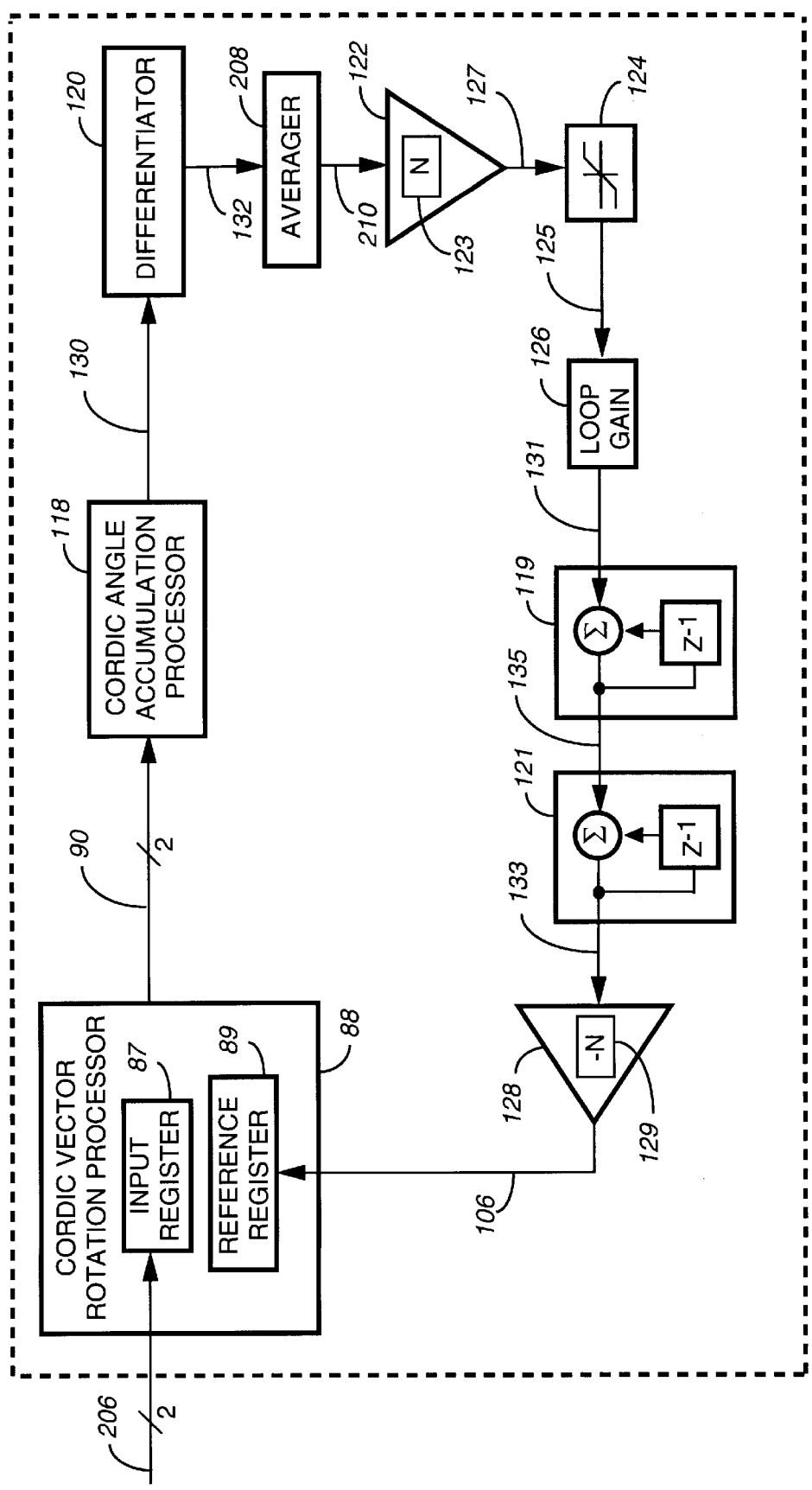
FIG. 15 is an electrical block diagram of an alternate embodiment of the automatic frequency control circuit of FIG. 7.

FIG. 15 is an electrical block diagram of an alternate embodiment of the automatic frequency control circuit 84. This embodiment would be utilized when the broadcast input signal 14 received by the digital receiver 10 includes multiple, fluctuating tones such as, for example, a Flex™ or ReFlex™ protocol based signal developed by Motorola Inc. It is apparent to one skilled in the art that this discussion is applicable to other similar signaling schemes. In FIG. 15, the multi-tone digital baseband signal 206 includes a plurality of desirable signals 91 (refer to FIG. 4), each having a variable frequency component. The operation of the automatic frequency control circuit of FIG. 15 is similar to the operation of the automatic frequency control circuit of FIG. 7 with the following exceptions.

The automatic frequency control circuit of FIG. 15 does not include a pilot filter 116. Instead, the CORDIC Angle Accumulation Processor 118 is directly coupled to the output of the CORDIC Vector Rotation Processor 88, receives the frequency shifted signal 90 and performs the CORDIC Computing Technique 81 on this signal. The angle accumulated signal 130 is then differentiated by the differentiator 120, and then the differentiated signal 132 is received by an averager 208, coupled to the output of the differentiator 120, which averages the minimum and maximum values of the differentiated signal 132, generating an averaged signal 210. The output of the averager 208 is coupled to the input of the first multiplier 122. Thereafter, operation of the remainder of the automatic frequency control circuit of FIG. 15 is similar to that previously described for the automatic frequency control circuit of FIG. 7.

Figure 16:
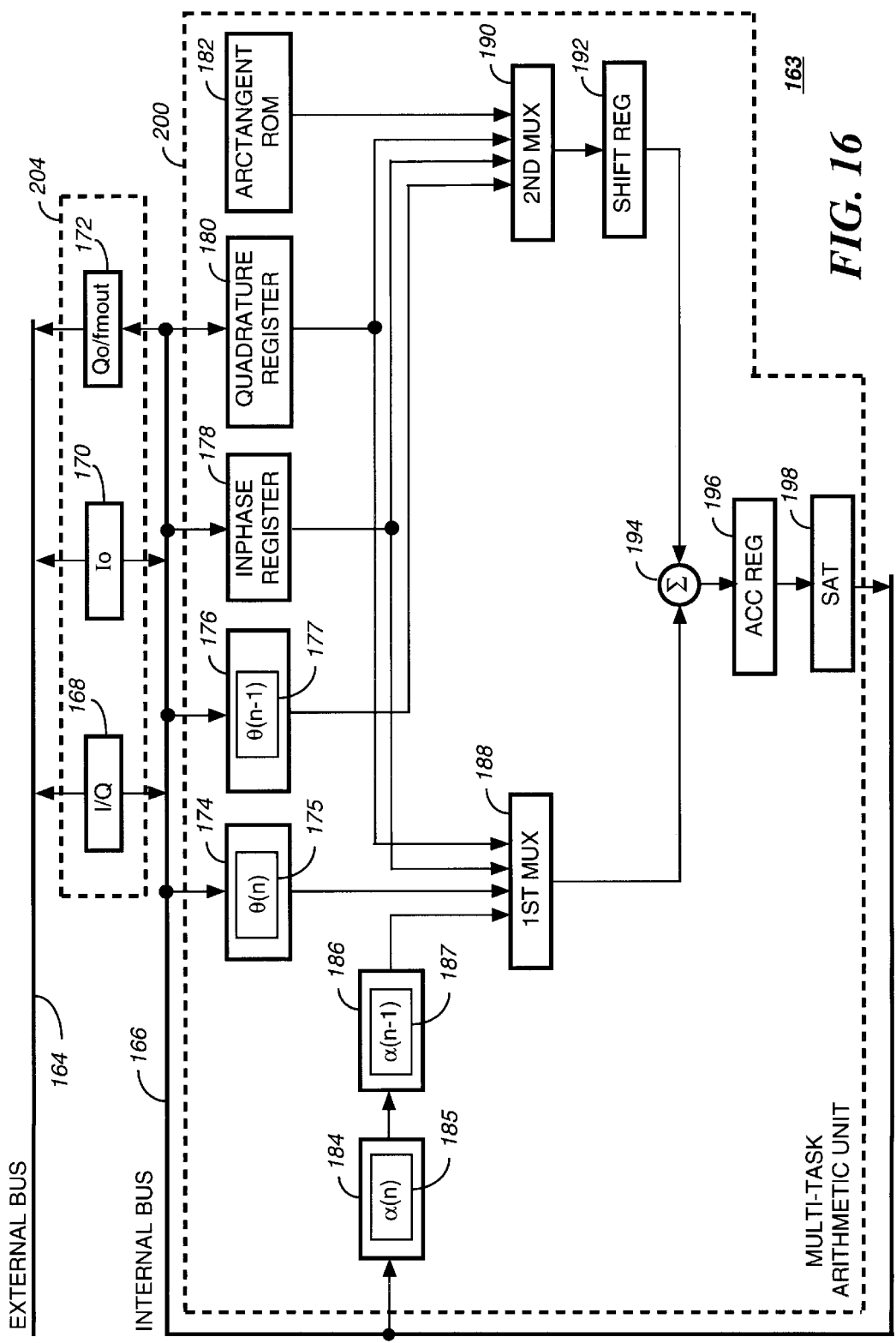
FIG. 16 is an electrical block diagram of a processor architecture implementing the automatic frequency control circuit shown in FIG. 7.

FIG. 16 is an electrical block diagram of a processor architecture 163 which implements the automatic frequency control circuit 84 of FIG. 7 with minimal hardware, allowing all circuitry of the processor architecture 163 to be contained on one integrated circuit. This processor architecture 163 performs the functions of the CORDIC vector rotation processor 88, the CORDIC angle accumulation processor 118, the differentiator 120, the limiter 124, the first integrator 119 and the second integrator 121 of FIG. 7. Hardware savings from re-using the various components of the processor architecture for multiple blocks in the automatic frequency control circuit allows lower costs and smaller sized digital receiver implementations.

The processor architecture 163 of FIG. 16 is comprised of a set of input/output registers 204 and a multi-task arithmetic unit 200.

The set of input/output registers 204 includes an I/Q input register 168, an Io output register 170, and a Qo/Fmout output register 172. An external bus 164, coupled to the set of input/output registers 204, is a path for input and output of data to and from the digital receiver circuitry (not shown). The output of the set of input/output registers 204 is received by an internal bus 166 for transfer of data to the multi-task arithmetic unit 200.

The I/Q input register 168, which is similar to the input register 87 of FIG. 7, stores the received digital baseband signal 86. The Io output register 170 stores the frequency shifted in-phase signal 95 of the frequency shifted signal 90, generated by the CORDIC computing technique 81 performed on the digital baseband signal 86. The Qo/Fmout output register 172 stores the frequency shifted quadrature signal 97 of the frequency shifted signal 90, and also stores the angle accumulated signal 130, which is the output of the CORDIC computing technique 81 (performed, for example by the CORDIC angle accumulation processor 118 of FIG. 7). This sharing of storage registers is a significant improvement over conventional circuitry which require two separate storage registers.

The set of input/output registers 204 may be implemented in a number of ways such as in RAM or as discrete registers on an integrated circuit, as one skilled in the art will appreciate.

The multi-task arithmetic unit 200 performs the mathematical operations utilized in the CORDIC computing technique 81, the differentiation, and the integration functions, all of which were discussed previously. The multi-task arithmetic unit 200 is comprised of an in-phase register 178, a quadrature register 180, a first angular register 174, a first temporary value angular register 176, a first multiplexer 188, a second multiplexer 190, a shift register 192, an adder/subtractor 194, an accumulator register 196, a saturation logic 198, a second angular register 184, a second temporary value angular register 186, and an arctangent ROM 182.

The internal bus 166 couples the components of the multi-task arithmetic unit 200, and also couples the multi-task arithmetic unit 200 to the set of input/output registers 204 for data transfer.

The first multiplexer 188 receives the outputs of the in-phase register 178, the quadrature register 180, the first angular register 174, and the second temporary value angular register 186. The second multiplexer 190 receives the outputs of the in-phase register 178, the quadrature register 180, the first temporary value angular register 176, and the arctangent ROM 182. The arctangent ROM 182 is a memory which stores one or more values for use in the CORDIC computing technique 81. The shift register 192 receives as its input the output of the second multiplexer 190, and shifts to the right which is equivalent to a division of a power of two. The shift operation is determined by an iteration number. The adder/subtractor 194 receives as its two inputs the output of the shift register 192 and the output of the first multiplexer 188. The operation of the adder/subtractor 194 is determined by β, where β is defined by the sign of Q from the previous iteration in angle accumulation mode and by sign of θ from the previous iteration in vector rotation mode. The accumulator register 196 receives as its input the output of the adder/subtractor 194. The saturation logic 198 receives as its input the output of the accumulator register 196 and selectively clips or limits this signal before providing its output to the internal bus 166.

With reference to FIG. 16, in operation, the external bus 164 brings an input signal such as the digital baseband signal 86 to the processor architecture 163. The processor architecture 163 receives the digital baseband signal 86 including the in-phase signal 110 and the quadrature signal 112, and enters them through an I/Q input register 168.

Once the values are loaded in the in-phase register 178 and the quadrature register 180 through the internal bus 166, the various algorithms may commence. During angle accumulation mode, for iteration j=0, the angle θ(n,0) is computed by reading location 0 from the arctangent ROM 182, providing the result through the second multiplexer 190 and the shift register 192 and adding/subtracting it from 0, which is loaded into the adder/subtractor 194. The addition or subtraction is dependent on the sign of the quadrature value in the quadrature register 180. The output of the adder/subtractor 194 is stored in the accumulator register 196. On the following cycle, the accumulator value is passed through the saturation logic 198 without clipping and stored in the first angular register 174, while the output of the quadrature register 180 is passed through the second multiplexer 190 to be added/subtracted from 0. The output of the adder/subtractor 194 is stored in the accumulator register 196. On the following cycle, the value in the accumulator register 196 is passed through the saturation logic 198 without clipping and stored in the in-phase register 178, while the previous value of the in-phase register is passed through the second multiplexer 190 and shift register 192 to be added/subtracted from 0. The output of this operation is then stored in the accumulator register 196 until the next cycle. Each iteration take three cycles.

For iteration j=1, the angle θ(n,1) is computed by reading location 1 from the arctangent ROM 182, providing the result through the second multiplexer 190 and the shift register 192 and adding/subtracting it from the previous iteration θ(n,0), a first angle 175, in the first angular register 174, which is loaded into the adder/subtractor 194, via the first multiplexer 188. The output of the adder/subtractor 194 is stored in the accumulator register 196. On the following cycle, the accumulator value is passed through the saturation logic 198 without clipping, while the output of the quadrature register 180 is passed through the second multiplexer 190 and the shift register 192 to be added/subtracted from I(n,0). The output of the adder/subtractor 194 is stored in the accumulator register 196. On the following cycle, the value in the accumulator register 196 is passed through the saturation logic 198 without clipping and stored in the in-phase register 178, while the previous output of the in-phase register 178 is passed through the second multiplexer 190 and the shift register 192 to be added/subtracted from Q(n,0). The output of this operation is then stored in the accumulator register 196 until the next cycle.

After L iterations, the value of the last location in the arctangent ROM 182 is presented through the second multiplexer 190 and the shift register 192 to be added/subtracted from θ(n, L).

The output of the adder/subtractor 194 is stored in the accumulator register 196. In the following cycle the value in the accumulator register 196 is passed without clipping through the saturation logic 198 and saved in the first angular register 174 and the quadrature register 180. The frequency information is computed by subtracting the output of the first temporary value angular register 176 (a previous angle 177) through the second multiplexer 190 and the shift register 192 from the output of the first angular register 174, (the first angle 175). The output of this is stored in the accumulator register 196. On the following cycle this information is passed through the saturation logic 198 without clipping and stored in the Qo/Fmout output register 172. On the next cycle, the accumulator output is also passed through the saturation logic 198 and stored temporarily in the in-phase register 178. This value is proportional to the frequency in the digital baseband signal 86. Simultaneously or in the next cycle, the updated θ(n, L) value which has been temporarily stored in the quadrature register 180 is added to 0. The output of the adder/subtractor 194 is stored in the accumulator register 196.

On the following cycle the output of the accumulator register 196 is passed through the saturation logic 198 without clipping and stored as the first previous angle 177 in the first temporary value angular register 176. At the same time, the output of the in-phase register 178 which contained the value proportional to the frequency is passed through the second multiplexer 190 and scaled by the loop gain constant $2^{(-K)}$ through the shift register 192. This value is presented to the adder/subtractor 194 and added to the output of the second temporary value angular register 186(the second previous angle 187). The output of the adder/subtractor 194, is stored in the accumulator register 196, and represents the summation of the frequency error. On the following cycle, the output of the accumulator register 196 is passed through the saturation logic 198 without clipping and stored in the in-phase register 178, while the second temporary value angular register 186 is loaded from the second angular register 184 (a second angle 185). On the next cycle the value in the in-phase register 178 is presented to the adder/subtractor 194 via the second multiplexer 190 and shift register 192 to be added with the value in the second temporary value angular register 186, provided by the first multiplexer 188. At the same time, the output of the accumulator register 196 is passed through the saturation logic 198 without clipping and stored in the 2nd angular register 184. On the following cycle, the value in the 2nd angular register 184 is loaded into the second temporary value angular register 186 and the value in the accumulator register 196 is temporarily stored in the in-phase register 178. A cycle later, the output of the accumulator register 196 is passed through the saturation logic 198 without clipping and stored in the 2nd angular register 184, while the value in the in-phase register 178 is subtracted from zero and the result stored in the accumulator register 196. On the final cycle, the value in the accumulator register 196 is passed through the saturation logic 198, without clipping and stored in the first angular register 174, which becomes the reference used by the vector rotation algorithm.

FIG. 17 summarizes the above described angle accumulation operation.

During the vector rotation mode, the I(n) and Q(n) input values are loaded from the external bus 164 through the I/Q input register 168 into the inphase register 178 and quadrature register 180. Once this is done the output of the quadrature register 180 is passed through the second multiplexer 190 and shift register 192 to be added/subtracted from 0. The output of the adder/subtractor 194, is stored in the accumulator register 196. On the following cycle the output of the accumulator register 196 is passed through the saturation logic 198 without clipping to be stored in the in-phase register 178. Simultaneously, the previous output of the in-phase register 178 is passed through the second multiplexer 190 and shift register 192 to be added/subtracted from 0. The output of the adder/subtractor 194 is stored in the accumulator register 196.

On the next cycle, the value in the accumulator register 196 is passed without clipping through the saturation logic 198 and stored in the quadrature 180, while the first location of the arctangent ROM 182 is read and passed through the second multiplexer 190 and shift register 192 to be added/subtracted from the output of the first angular register 174 (the first angle 175) provided to the adder/subtractor 194 via the first multiplexer 188. The subsequent operations are similar to the ones in the vector rotation mode except that the adder/subtractor operation is determined by the sign of the first angle 175.

On the last iteration, the result of adding/subtracting the output of the in-phase register 178 and the shifted output of the quadrature register 180 is stored in the accumulator register 196. The output of which is passed through the saturation logic 198 without clipping and stored in the Io output register 170. The result of adding/subtracting the output of the quadrature register 180 and the shifted output of the in-phase register 178 is stored in the accumulator register 196. The output of the accumulator register 196 is passed through saturation logic 198 without clipping and stored in the Qo/Fmout output register 172.

FIG. 18 summarizes the above described vector rotation operation.

To summarize, the automatic frequency control circuit 84 in general, and the processor architecture 163 in specific, is an efficient, cost effective implementation of high precision automatic frequency control with low processing power requirements, providing a significant advantage in the design of low power, small sized digital receivers such as those used in pagers, cellular phones, and land mobile communicators.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. In a digital receiver that converts a broadcast input signal to a digital baseband signal, an automatic frequency control circuit for minimizing a frequency difference between a reference signal and the digital baseband signal, the automatic frequency control circuit comprising:

a CORDIC vector rotation processor, receiving the digital baseband signal and receiving the reference signal, and performing a CORDIC computing technique to frequency shift the digital baseband signal using the reference signal, thereby generating a frequency shifted signal including a frequency shifted pilot tone;

a pilot filter receiving and filtering the frequency shifted signal, leaving a frequency shifted pilot tone remaining;

a CORDIC angle accumulation processor, coupled to the pilot filter, receiving the frequency shifted pilot tone and performing the CORDIC computing technique to generate an angle accumulated signal;

a differentiator, coupled to the CORDIC angle accumulation processor, and receiving the angle accumulated signal and performing a differentiation on the angle accumulated signal to generate a differentiated signal;

a first multiplier, coupled to the differentiator and receiving the differentiated signal and normalizing the differentiated signal by a first constant value to generate a normalized signal;

a limiter, coupled to the first multiplier, receiving the normalized signal and scaling and clipping the normalized signal to generate a limited signal;

a loop gain, coupled to the limiter and receiving the limited signal and scaling the limited signal to generate a scaled signal;

a first integrator, coupled to the loop gain, the first integrator generating a frequency accumulated signal by performing a successive accumulation of a plurality of scaled signals;

a second integrator, coupled to the first integrator, the second integrator generating a phase whose corresponding frequency converges on the frequency of the digital baseband signal by performing a successive accumulation of the frequency accumulated signal; and a second multiplier, coupled to the second integrator and receiving the phase and denormalizing the phase by a second constant value to generate the reference signal received by the CORDIC vector rotation processor.

2. The automatic frequency control circuit of claim 1, wherein the CORDIC vector rotation processor further comprises an input register for storing the digital baseband signal.

3. The automatic frequency control circuit of claim 1, wherein the CORDIC vector rotation processor further comprises a reference register for storing the reference signal.

4. In a digital receiver that converts a broadcast input signal to a digital baseband signal, an automatic frequency control circuit for minimizing a frequency difference between a frequency of a reference signal and a frequency of the digital baseband signal, the automatic frequency control circuit comprising:

a CORDIC vector rotation processor, receiving the digital baseband signal and receiving the reference signal, and performing a CORDIC computing technique to frequency shift the digital baseband signal using the reference signal, thereby generating a frequency shifted signal;

a CORDIC angle accumulation processor, coupled to the CORDIC vector rotation processor, receiving the frequency shifted signal and performing the CORDIC computing technique on the frequency shifted signal to generate an angle accumulated signal;

a differentiator, coupled to the CORDIC angle accumulation processor, and receiving the angle accumulated signal and performing a differentiation on the angle accumulated signal to generate a differentiated signal;

an averager, coupled to the differentiator, generating an averaged signal from the differentiated signal;

a first multiplier, coupled to the averager, generating a normalized signal by normalizing the average signal by a first constant value;

a limiter, coupled to the first multiplier, receiving the normalized signal and scaling and clipping the normalized signal to generate a limited signal;

a loop gain, coupled to the limiter and receiving the limited signal and scaling the limited signal to generate a scaled signal;

a first integrator, coupled to the loop gain, the first integrator generating a frequency accumulated signal by performing a successive accumulation of a plurality of scaled signals;

a second integrator, coupled to the first integrator, the second integrator generating a phase whose corresponding frequency converges on the frequency of the digital baseband signal by performing a successive accumulation of the frequency accumulated signal; and a second multiplier, coupled to the second integrator and receiving the phase and denormalizing the phase by a second constant value to generate the reference signal received by the CORDIC vector rotation processor.

5. In a digital receiver that converts a broadcast input signal to a digital baseband signal, a method for automatic frequency control which minimizes a frequency difference between a frequency of a reference signal and a frequency of the digital baseband signal, the method for automatic frequency control comprising:

(a) performing a CORDIC computing technique to frequency shift the digital baseband signal using the reference signal to generate a frequency shifted signal including a frequency shifted pilot tone;

(b) filtering the frequency shifted signal, leaving the frequency shifted pilot tone remaining;

(c) performing the CORDIC computing technique on the frequency shifted pilot tone to generate an angle accumulated signal;

(d) differentiating the angle accumulated signal to generate a differentiated signal;

(e) normalizing the differentiated signal by a first constant value to generate a normalized signal;

(f) scaling and clipping the normalized signal to generate a limited signal;

(g) scaling the limited signal to generate a scaled signal;

(h) successively accumulating a plurality of scaled signals to generate a frequency accumulated signal;

(i) successively accumulating the frequency accumulated signal to generate a phase whose corresponding frequency converges on the frequency of the digital baseband signal; and (j) denormalizing the phase with a second constant value to generate the reference signal.

6. The method of claim 5, further comprising:

(i) repeating steps (a) through (j) through one or more iterative cycles.

7. In a digital receiver that converts a broadcast input signal to a digital baseband signal, a processor architecture for implementing an automatic frequency control circuit, the automatic frequency control circuit minimizing a frequency difference between a reference signal and the digital baseband signal, the processor architecture comprising:

a set of input/output registers receiving the digital baseband signal, and receiving the reference signal, wherein the set of input/output registers is comprised of:

an I/Q input register, receiving and storing the digital baseband signal including an in-phase signal and a quadrature signal, an Io output register, receiving and storing the in-phase signal of the reference signal, and a Qo/Fmout output register, receiving and storing the quadrature signal of the reference signal, and receiving and storing an angle accumulated signal;

a multi-task arithmetic unit, performing a CORDIC computing techniques, a successive accumulation, a differentiation, and an integration; and an internal bus coupled to the set of input/output registers and further coupled to the multi-task arithmetic unit, for transfer of data.

8. The processor architecture of claim 7, wherein the I/Q input register, the Io output register, and the Qo/Fmout output register comprise discrete registers on an integrated circuit.

9. The processor architecture of claim 7, wherein the I/Q input register, the Io output register, and the Qo/Fmout output register comprise RAM on an integrated circuit.

10. In a digital receiver that converts a broadcast input signal to a digital baseband signal, a processor architecture for implementing an automatic frequency control circuit, the automatic frequency control circuit minimizing a frequency difference between a reference signal and the digital baseband signal, the processor architecture comprising:

a set of input/output registers receiving the digital baseband signal, and receiving the reference signal;

a multi-task arithmetic unit, performing a CORDIC computing techniques, a successive accumulation, a differentiation, and an integration, wherein the multi-task arithmetic unit is comprised of:

an in-phase register, receiving and storing a frequency shifted in-phase signal of a frequency shifted signal, wherein the frequency shifted signal is a result of performing a CORDIC computing technique on the digital baseband signal, a quadrature register, receiving and storing a frequency shifted quadrature signal of the frequency shifted signal, a first angular register, receiving and storing a first angle and outputting a first previous angle, a first temporary value angular register, receiving and storing a first previous angle from the first angular register, a second angular register, receiving and storing a second angle and outputting a second previous angle, a second temporary value angular register, receiving and storing the second previous angle from the second angular register;

an arctangent ROM for storing one or more values used in the CORDIC computing technique, a first multiplexer, receiving an output of the in-phase register, an output of the quadrature register, and an output of the second temporary value angular register, a second multiplexer, receiving the output of the in-phase register, the output of the quadrature register, an output of the first temporary value angular register, and an output of the arctangent ROM, a shift register, receiving an output of the second multiplexer, and performing a shift of the output of the second multiplexer, an adder/subtractor, receiving an output of the shift register and an output of the first multiplexer, and performing an addition or subtraction of the outputs of the shift register and the first multiplexer, an accumulator register, receiving a plurality of outputs of the adder/subtractor and performing a successive accumulation of the plurality of outputs of the adder/subtractor, and a saturation logic, receiving an output of the accumulator register and selectively clipping or limiting the output of the accumulator register prior to outputting to an internal bus; and an internal bus coupled to the set of input/output registers and further coupled to the multi-task arithmetic unit, for transfer of data.

* * * * *